(12) United States Patent
Lucas et al.

(10) Patent No.: US 7,492,154 B2
(45) Date of Patent: Feb. 17, 2009

(54) METHOD OF CARRYING OUT DYNAMIC NUCLEAR POLARIZATION

(75) Inventors: Alun J Lucas, Hertfordshire (GB); Robert Andrew Slade, Oxfordshire (GB)

(73) Assignee: Oxford Instruments Molecular Biotools Limited

( * ) Notice: Subject to any disclaimer, the term of this patent is extended or adjusted under 35 U.S.C. 154(b) by 0 days.

(21) Appl. No.: 11/814,463

(22) PCT Filed: Nov. 29, 2005

(86) PCT No.: PCT/GB2005/004567

§ 371 (c)(1),
(2), (4) Date: Jul. 20, 2007

(87) PCT Pub. No.: WO2006/077361

PCT Pub. Date: Jul. 27, 2006

(65) Prior Publication Data

US 2008/0100293 A1    May 1, 2008

(30) Foreign Application Priority Data

Jan. 21, 2005   (GB) ................................ 0501346.1

(51) Int. Cl.
*G01V 3/00* (2006.01)
(52) U.S. Cl. ...................................... 324/309; 324/300
(58) Field of Classification Search ......... 324/300–322; 600/407–499
See application file for complete search history.

(56) References Cited

U.S. PATENT DOCUMENTS

| | | | | |
|---|---|---|---|---|
| 3,792,246 A * | 2/1974 | Gilbreath et al. | ............ | 708/809 |
| 4,124,466 A * | 11/1978 | Morrey | .................. | 204/157.41 |
| 4,345,207 A * | 8/1982 | Bertrand et al. | ............. | 324/308 |
| 5,345,174 A * | 9/1994 | Kimmich et al. | ............ | 324/309 |
| 6,184,683 B1 * | 2/2001 | Emsley et al. | ............... | 324/309 |
| 6,574,496 B1 * | 6/2003 | Golman et al. | .............. | 600/420 |
| 7,199,584 B2 * | 4/2007 | Meriles | ...................... | 324/316 |

OTHER PUBLICATIONS

Carraveta M., et al., "Beyond the T1 Limit: Singlet Nuclear Spin States in Low Magnetic Fields," Physical Review Letters, vol. 92, Apr. 16, 2004, pp. 153003/1-4.
Wolber J. et al., "Generating Highly Polarized Nuclear Spins in Solution Using Dynamic Nuclear Polarization," Nuclear Instruments & Methods in Physics Research, Section A (Accelerators, Spetometers, Detectors and Associated Equipment), vol. 526, Jun. 21, 2004, pp. 173-181, XP002345006.
M. Caravetta et al., "Long-Lived Nuclear Spin States in High-Field Solution NMR," Journal of the American Chemical Society, vol. 126, May 26, 2004, pp. 6228-6229, XP002298311.
Ardenkjaer-Larsen J. H. et al., "Increase in Signal-to-Noise Ration of > 10,000 Times in Liquid-State NMR," Proceedings of the National Acamedy of Sciences of USA, vol. 100, Sep. 2, 2003, pp. 10158-10163, XP002280244.

* cited by examiner

*Primary Examiner*—Brij B Shrivastav
(74) *Attorney, Agent, or Firm*—Blank Rome LLP

(57) ABSTRACT

A method of carrying out DNP on a sample with a molecular structure containing at least two J-coupled non-integer spin nuclear species, the method comprising hyperpolarizing the sample in a cooled, solid form while it is exposed to a homogeneous magnetic field of suitable strength; dissolving or melting the hyperpolarized sample; subjecting the sample to a polarization holding RF pulse sequence while the sample is exposed to a suitably homogeneous magnetic field of sufficient strength to ensure the spin's chemical shift is greater than the J-coupling, the pulse sequence causing the nuclear spin populations in the sample to be re-distributed between a plurality of energy levels in a non-equilibrium manner; and then, following a time less than the T1, relaxation time constant of the molecular species, causing the nuclear spin populations to transfer adiabatically to stable, equilibrium levels.

25 Claims, 5 Drawing Sheets

METHOD OF CARRYING OUT DYNAMIC NUCLEAR POLARIZATION

CROSS-REFERENCE TO RELATED APPLICATIONS

This application is a National Phase Application of PCT/GB2005/004567, filed on Nov. 29, 2005, which claims priority to GB 0501346.1 filed on Jan. 21, 2005, which is hereby incorporated by reference.

The invention relates to methods for carrying out dynamic nuclear polarization (DNP).

DNP is used to increase polarization of nuclear spins in a sample for the purposes of nuclear magnetic resonance spectroscopy (NMR), magnetic resonance imaging (MRI) and other known techniques which monitor the spin states of nuclear species in a sample.

A typical DNP process involves mixing the target material with a free radical polarizing agent and cooling this sample, typically to liquid helium temperatures, where it freezes. While the sample is exposed to a homogeneous, high strength magnetic field, it is subjected to microwave irradiation to cause hyperpolarization of nuclei in the sample by DNP. The hyperpolarized sample is then dissolved or melted whilst still subject to the homogeneous magnetic field and then rapidly transferred to a separate system for analysis (in the case of NMR) or use as an in-vivo contrast agent for MRI.

A problem with these known methods is the need for rapid transfer since otherwise the sample loses its hyperpolarized state.

In accordance with the present invention, a method of carrying out DNP on a sample with a molecular structure containing at least two J-coupled non-integer spin nuclear species comprises hyperpolarizing the sample in a cooled, solid form while it is exposed to a homogeneous magnetic field of suitable strength; dissolving or melting the hyperpolarized sample; subjecting the sample to a polarization holding RF pulse sequence while the sample is exposed to a suitably homogeneous magnetic field of sufficient strength to ensure the spin's chemical shift is greater than the J-coupling, the pulse sequence causing the nuclear spin populations in the sample to be re-distributed between a plurality of energy levels in a non-equilibrium manner; and then, following a time less than the $T_1$ relaxation time constant of the molecular species, causing the nuclear spin populations to transfer adiabatically to stable, equilibrium levels.

The resultant triplet state rapidly equilibrates whilst the singlet state is isolated from intramolecular dipole-dipole coupling, and is therefore preserved with time constant much longer than T1.

We have realized that a technique exists which enables the hyperpolarization condition of a sample to be maintained for longer than the $T_1$ relaxation time constant and this has a significant advantage of allowing more time to transfer the hyperpolarized sample to an analysis system or for preparation before injection into a body.

In the preferred approach, the step of causing the nuclear spin population to transfer adiabatically to stable, equilibrium levels comprises exposing the sample to a low strength or zero magnetic field.

This approach can be achieved, for example, by transporting the hyperpolarized sample to a separate region where a low strength magnetic field is generated, for example the fringe field of the magnetic field used during the polarization holding RF pulse sequence, or into the influence of a separate magnetic field. A particularly advantageous approach, however, is simply to move the sample out of the influence of the high strength magnetic field utilized during the polarization holding RF pulse sequence. Thus, removing the sample completely from a cryostat in which it has been hyperpolarized so it is then subject simply to the Earth's magnetic field will suffice. This makes this method particularly suitable for use in commercial DNP processes.

This technique for causing the nuclear spin populations to transfer adiabatically to stable, equilibrium levels is described in "Beyond the $T_1$ Limit: Singlet Nuclear Spin States in Low Magnetic Fields", Carravetta et al, Physical Review Letters, Vol. 92, No. 15. (We will refer to this paper as Carravetta 1.)

In an alternative approach, the step of causing the nuclear spin population to transfer adiabatically to stable, equilibrium levels comprises subjecting the sample to a continuous wave RF pulse.

Usually, the CW RF pulse is applied while the sample is exposed to a homogeneous magnetic field and this field will usually have a high strength, typically being similar to that applied during the polarization stage. The homogeneity is preferably better than 50 ppm for a single CW pulse although a lower homogeneity could be tolerated with more complex pulses. The second method is described in more detail is "Long-Lived Nuclear Spin States in High-Field Solution NMR", Carravetta et al, J. Am. Chem. Soc. 2004, 126, 6228-6229. (We will refer to this paper as Carravetta 2.)

In some examples, the polarization holding RF pulse sequence is applied to the sample after it has been dissolved. In other cases, however, the pulse sequence could be applied prior to dissolving the sample.

The main advantage of applying the pulses before dissolving the sample is simpler, existing, hardware. The sample is already in a suitable magnetic field, and also normally inside a suitable RF coil (which is used, if desired, for monitoring the polarization build-up using small tip-angle pulses). If the pulses are applied after dissolving the sample, it must be moved out of the influence of the liquid helium.

Suitable field strength and homogeneity levels are:

During polarization: >1 T, preferably >3 T; <300 pm, preferably <100 ppm.

During application of polarization-holding RF pulse sequence: >0.1 T, preferably >1 T, most preferably the same as the polarization field; <300 ppm, preferably <100 ppm, most preferably <50 ppm.

During dissolution/melting: >1 T, preferably >3 T; no homogeneity requirement.

In this specification, homogeneity values are given with respect to the volume of the sample, typically a cylinder of 1 cm diameter and 2-3 cm length.

In the case of the first approach in which the sample is exposed to a low strength or zero magnetic field, the field strength is preferably less than 0.1 T and most preferably less than 0.0001 T (i.e. Earth's magnetic field). There is no homogeneity requirement.

The hyperpolarization process can be any known process such as DNP, when the sample is exposed to microwave radiation, or "brute force" hyperpolarization caused by simple cooling.

The stabilized, hyperpolarized sample can be used in any conventional application. In the case of NMR, for example, the sample can be placed in another high, homogeneous field and a readout pulse sequence applied to obtain NMR signals. This could be for spectroscopic or imaging applications. Typical magnetic field characteristics during readout are >0.2 T, preferably >1 T; homogeneity, preferably <300 ppm, preferably <50 ppm (i.e. conventional MRI).

In other examples, the sample could be conditioned whilst it is in the low field region to make it biologically tolerable (i.e. filtering, buffering, equilibrating to body temperature), then finally internalising in a live subject (by injection, IV drip, etc.) so that it can be used as a contrast agent for in-vivo imaging.

Some examples of methods according to the invention and an apparatus for carrying out those methods will now be described with reference to the accompanying drawings, in which.

Figure 1:
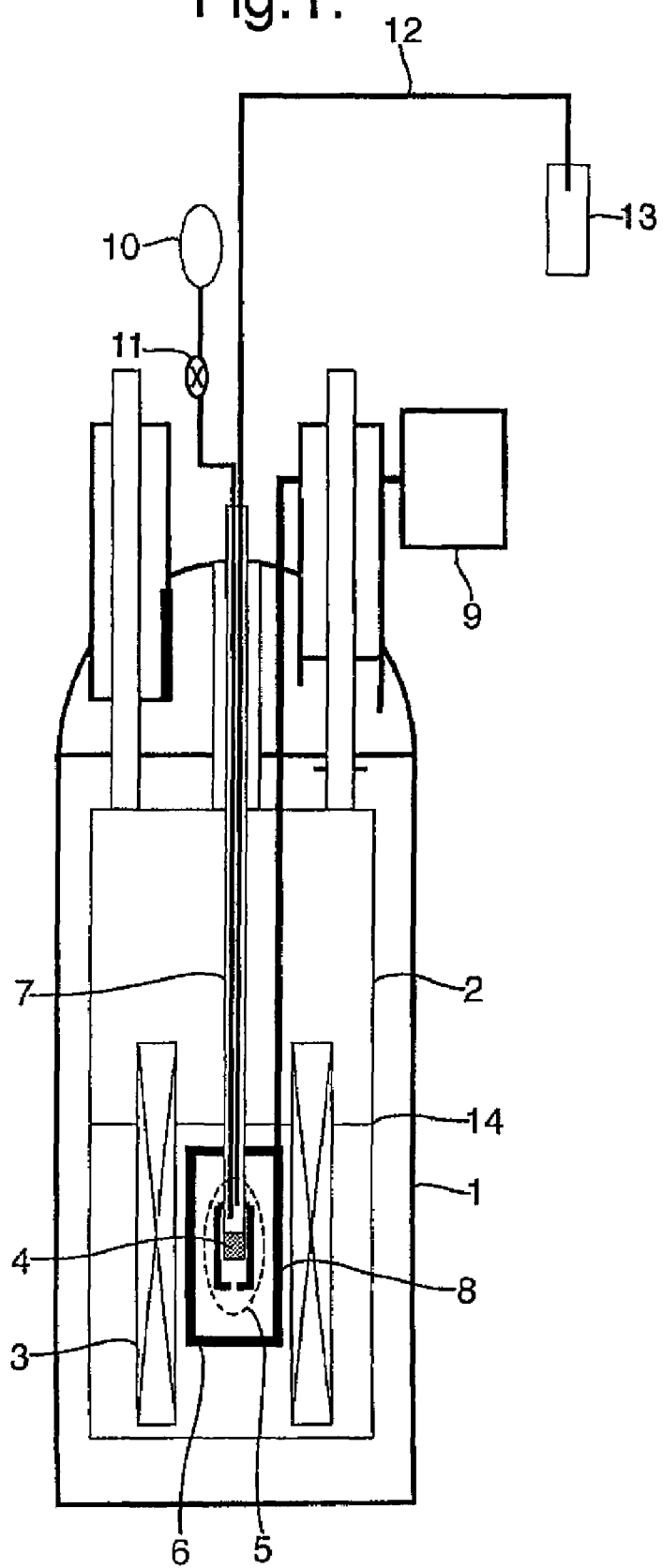
FIG. 1 is schematic section through a first example of apparatus for carrying out a method according to the invention.

The apparatus shown in FIG. 1 comprises a cryostat 1 in which is located a liquid helium containing vessel 2 and thermal shields (not shown). Within the vessel 2 is mounted a superconducting magnet 3 which generates a high strength, homogeneous magnetic field in a working volume 5. The liquid helium level in the vessel 2 is shown at 14.

The working volume 5 is situated within a microwave cavity 8 coupled via a suitable waveguide with a microwave source 9. Located within the working region 5 is an RF coil 6 and this surrounds in use a sample 4. The sample 4 is provided in a sample cup on the end of a dissolution stick 7 containing inlet and outlet pipes for solvent and shown in the diagram in the polarization position. The inlet pipe is coupled via a solvent release valve 11 with a solvent pressure vessel 10 while the outlet pipe is coupled via a pipe 12 with a collection cup 13.

Figure 4:
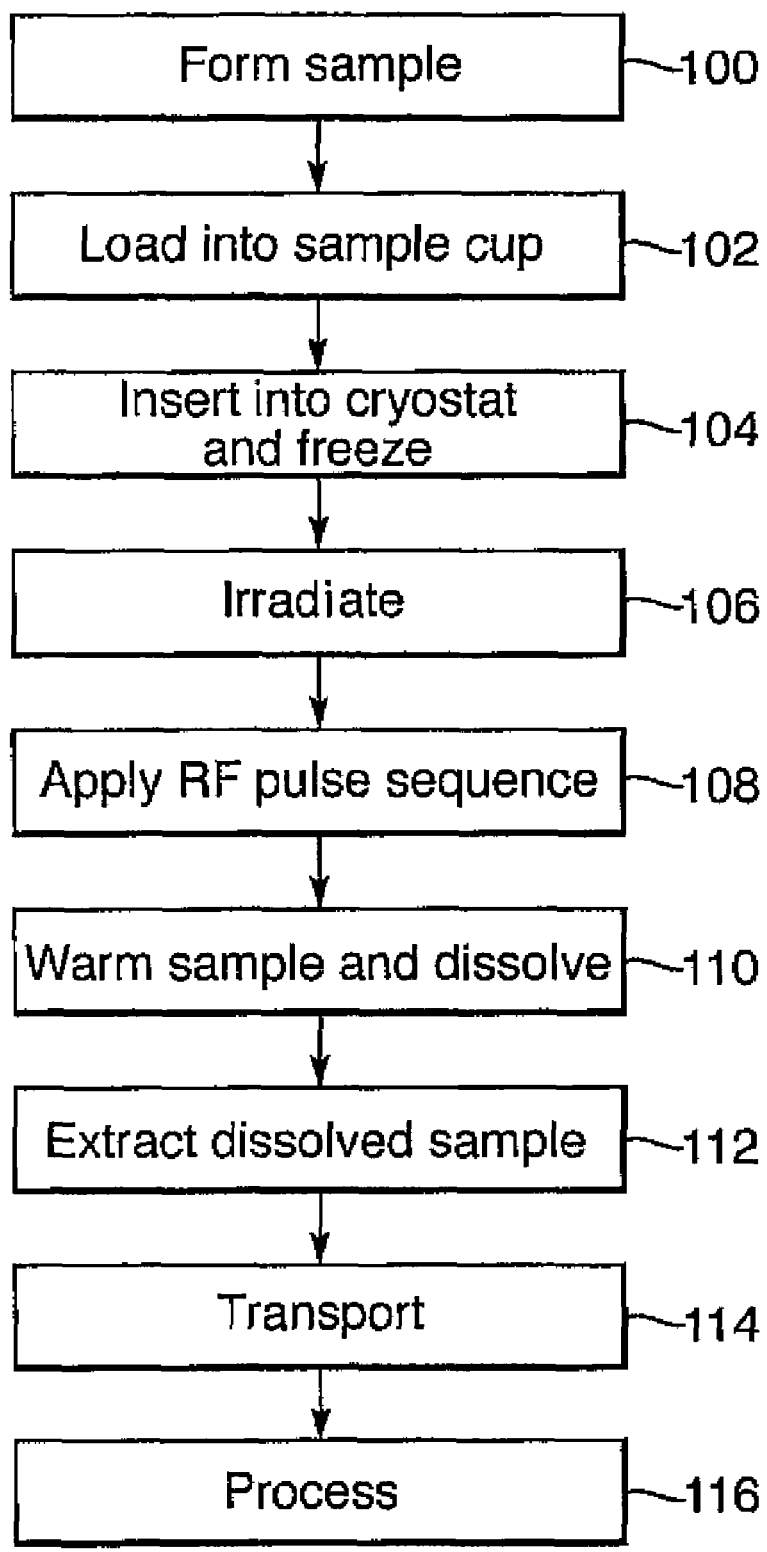
FIG. 4 is a flow diagram illustrating an example of a method of utilizing the apparatus shown in FIG. 1; and, FIG. 5 illustrates a pulse sequence suitable for use in the method of FIG. 4.

An example of a method according to the invention utilizing the apparatus shown in FIG. 1 will now be described with reference to the flow diagram of FIG. 4.

A target material to be hyperpolarized, whose molecular structure must contain at least two non-integer spin nuclear species (i.e. heteronuclear) with J-coupling (this is called an "AX spin system", where X is typically 13C and A is 1H), is mixed with a free radical polarizing agent (e.g. trityl). The mixture is now referred to generically as the sample, which, for example, could be used, after hyperpolarization, as a contrast agent for imaging. (Step 100)

The sample is loaded into a sample cup (step 102) and then the sample cup is lowered into the cryostat 1 until the sample is in the working region 5. As can be seen in FIG. 1, the working region is located below the level of the liquid helium 14 so that the sample is exposed to a very low temperature and thus will freeze. (Step 104)

As explained above, the magnet 3 generates a homogeneous, high strength magnetic field BO 101 (FIG. 5) in the working region 5, a preferred field strength and homogeneity being greater than 3 T and less than, i.e. better than, 100 ppm respectively.

Figure 5:
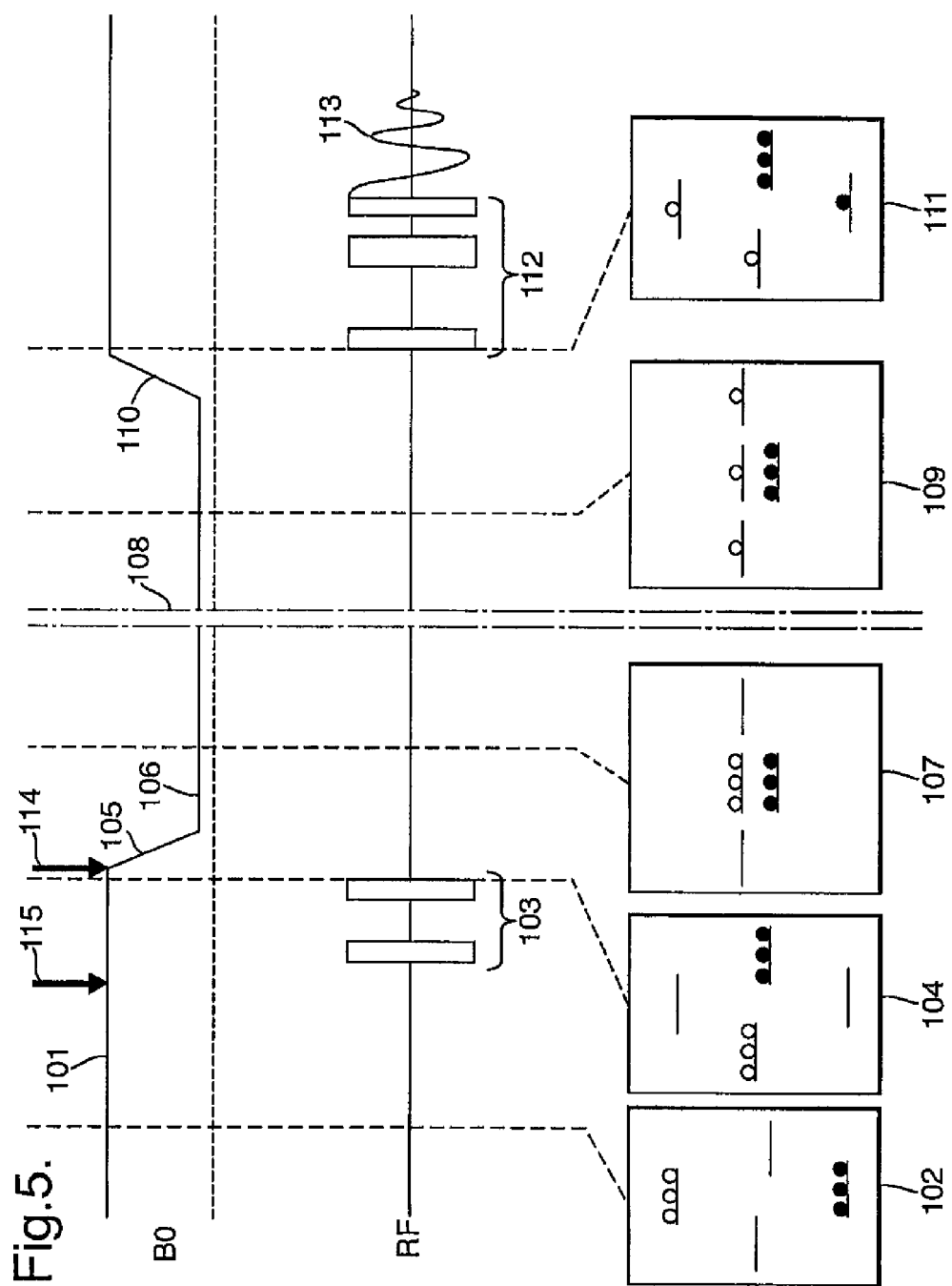

At that stage, the thermal equilibrium spin system energy level populations are indicated at 102 in FIG. 5 (where solid balls represent excess population, and empty balls represent depleted population).

The frozen sample is then irradiated with microwave radiation generated within the microwave cavity 8 to cause hyperpolarization of at least the X nuclei by DNP. The A nuclei may also be hyperpolarized simultaneously by the same process. The required microwave frequency is approximately the electron Larmor resonant frequency minus half the nuclear Larmor frequency. (Step 106) The DNP process substantially increases the population difference between the upper and lower energy levels, but does not otherwise change the distribution of the spins between energy levels.

The RF coil 6 is then controlled to subject the polarized sample to an RF pulse sequence using any of the techniques described in Carravetta 1. An example of a suitable pulse sequence is shown in FIG. 5 (step 108), the pulse sequence being indicated at 103. The energy level populations after the polarization-holding RF pulse sequence, whilst still in the strong $B_0$ field, are shown at 104 in FIG. 5.

The sample cup is then withdrawn above the level of the liquid helium 14, a dissolution stick 7 is inserted, and hot solvent supplied from the vessel 10 so as to dissolve the hyperpolarized sample (step 110) shown at 114 in FIG. 5. It will be noted that although the sample has been thermally isolated from the liquid helium, it remains within the influence of the strong magnetic field although not in the homogeneous region.

The dissolved sample is extracted through the outlet pipe 12 (step 112) and stored in the collection cup 13 and thus transported 105 to a low magnetic field region 106 in a time $<<T_1$. At this stage, the energy level populations are shown at 107. The sample is maintained in the low BO field for a long period, greater than $T_1$ and the energy level distribution changes to that shown at 109 which is a stable configuration with the sample hyperpolarized.

It can then be further transported (step 114) and processed (step 116) as will be described in more detail below. Importantly, the invention enables the time available for transportation and processing to be increased significantly over conventional times while maintaining the same degree of hyperpolarization. The time increase is at least twice, typically 10 times or more.

In the example just described, the RF pulse sequence is applied before the sample is dissolved, the timing of the dissolving step being indicated at 115.

Figure 2:
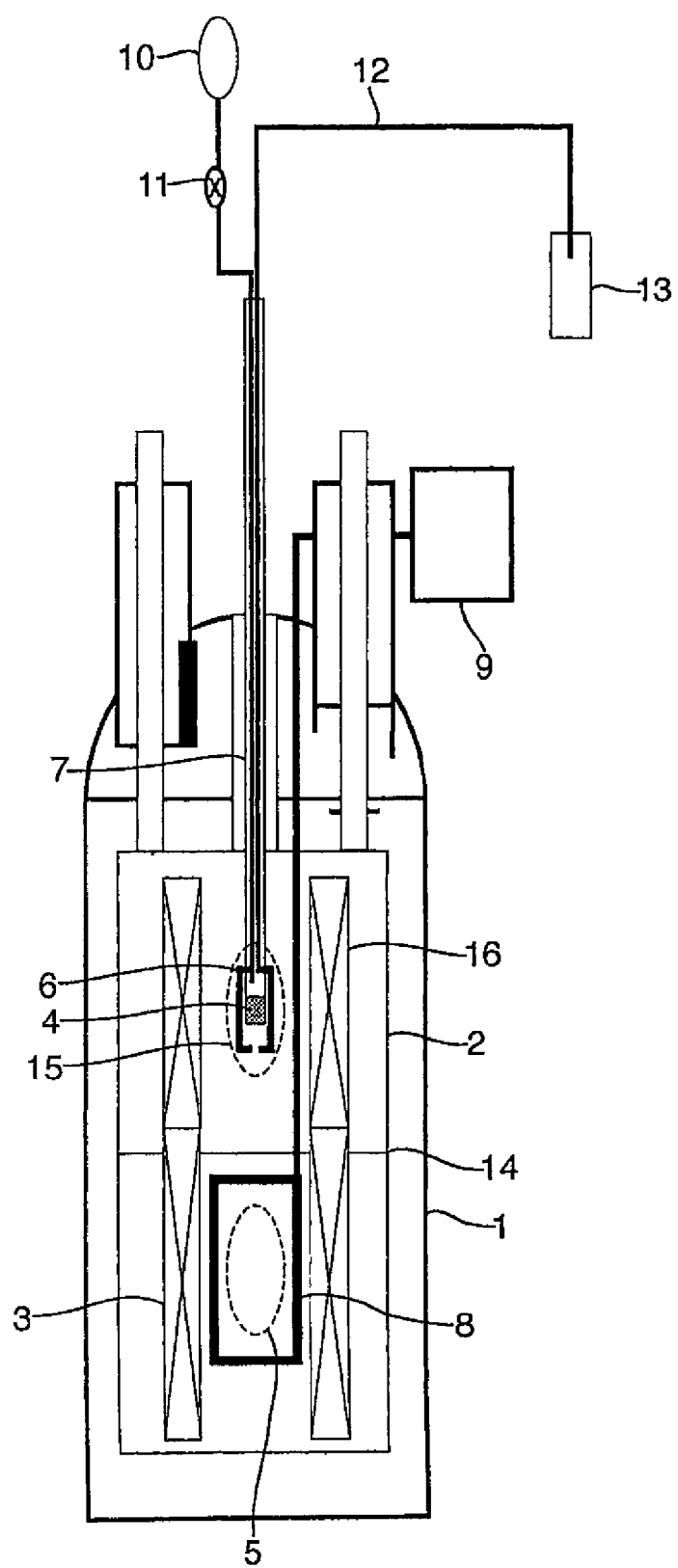
FIG. 2 is a view similar to FIG. 1 but of a second example of apparatus for carrying out another method according to the invention.

The apparatus shown in FIG. 2 enables the RF pulse sequence to be applied after the sample has been dissolved.

The FIG. 2 apparatus is similar to that shown in FIG. 1 except that a, typically superconducting, magnet 16 is located coaxially with the magnet 3. The magnet 16 generates its own homogeneous working volume 15. The magnetic field strength and homogeneity generated by the magnet 16 are typically greater than 1 T and less than 50 ppm respectively. It will also be noted that the RF coil 6 is now located within the working region 15 rather than the working region 5. In all other respects, the apparatus of FIG. 2 is the same as that shown in FIG. 1 and will not be further described.

The process using the FIG. 2 apparatus is similar to that described with reference to FIG. 4 except that steps 108 and 110 are reversed.

It will be understood that the sample could be melted instead of dissolved if suitable heaters are provided, so long as the melting process is quick compared to the T1 of the sample near its melting point, as described in prior art (ref. Ardenkjaer-Larsen et al in PNAS Vol. 100, #18, p. 10158-10163).

An important aspect of both these methods is that the sample is extracted from the influence of the high magnetic fields so as to be exposed to a very low, typically the Earth's, magnetic field and this will occur during the transportation process 114. As explained above, this stabilizes the hyperpolarized nuclear species.

Figure 3:
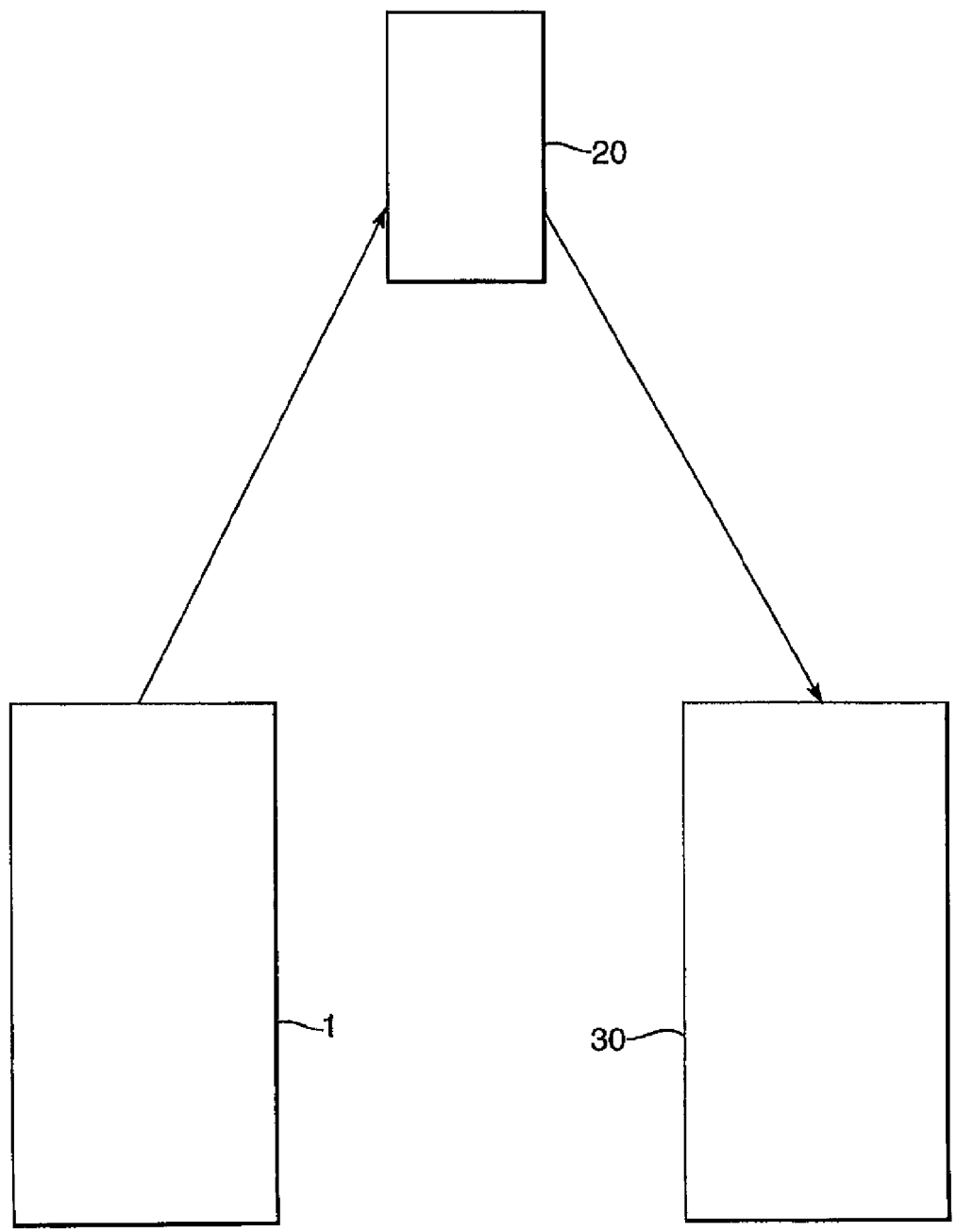
FIG. 3 illustrates schematically the overall layout of components for hyperpolarizing, conditioning and analysing a sample.

In the case of MRI, the stabilized hyperpolarized sample is transported from the cryostat 1 to sample conditioning hardware 20 (FIG. 3) where it is cooled, filtered to remove unwanted components (for example the free radical), buffered and injected into a human or animal. A conventional MRI readout system 30 then enables NMR signals to be received from the sample. Alternatively, in the case of NMR spectroscopy, the hyperpolarized sample is transported directly to an analysis system.

In any of these applications, in order to readout the information, the sample is exposed to a high $B_0$ magnetic field 110 and a readout pulse sequence 112 applied which converts the "frozen" singlet state to an observable NMR signal 113, the state of the energy levels after application of the high magnetic field and before the pulse sequence being shown at 111.

The invention claimed is:

1. A method of carrying out Dynamic Nuclear Polarization (DNP) on a sample with a molecular structure containing at least two J-coupled non-integer spin nuclear species, the method comprising the steps of:
   hyperpolarizing the sample in a cooled, solid form while it is exposed to a homogeneous magnetic field of suitable strength;
   dissolving or melting the hyperpolarized sample;
   subjecting the sample to a polarization holding RF pulse sequence while the sample is exposed to a suitably homogeneous magnetic field of sufficient strength to ensure the spin's chemical shift is greater than the J-coupling, where the pulse sequence causes the nuclear spin populations in the sample to be redistributed between a plurality of energy levels in a non-equilibrium manner; and
   causing the nuclear spin populations to transfer adiabatically to stable, equilibrium levels, following a time less than the T1 relaxation time constant of the molecular species.

2. A method according to claim 1, wherein the sample is subjected to the polarization holding RF pulse sequence after it has been dissolved in a solvent.

3. A method according to claim 1, wherein the sample is subjected to the polarization holding RF pulse sequence while the sample is still in its solid form.

4. A method according to claim 1, wherein the step of causing the nuclear spin population to transfer adiabatically to stable, equilibrium levels comprises exposing the sample to a low strength or zero magnetic field.

5. A method according to claim 4, wherein the step of exposing the sample to a low strength or zero magnetic field comprises moving the sample to a region where a low strength magnetic field is generated.

6. A method according to claim 4, wherein the step of exposing the sample to a low strength or zero magnetic field comprises moving the sample out of the influence of the high strength magnetic field.

7. A method according to claim 4, wherein the magnetic field strength during the nuclear spin population transfer step is less than 0.1T.

8. A method according to claim 1, wherein the step of causing the nuclear spin population to transfer adiabatically to stable, equilibrium levels comprises subjecting the sample to a continuous wave RF pulse.

9. A method according to claim 8, wherein the CW RF pulse is applied while the sample is exposed to a magnetic field.

10. A method according to claim 9, wherein the magnetic field has a high strength, similar to that applied during the polarization stage.

11. A method according to claim 1, wherein the magnetic field applied during the hyperpolarizing step has a strength of at least 1T.

12. A method according to claim 1, wherein the magnetic field applied during the hyperpolarizing step has a homogeneity of less than 300 ppm preferably less than 100 ppm.

13. A method according to claim 1, wherein the magnetic field applied during the polarization holding RF pulse sequence has a magnitude greater than 0.1T.

14. A method according to claim 1, wherein the magnetic field applied during the polarization holding RF pulse sequence has a field strength substantially the same as the magnetic field applied during the hyperpolarizing step.

15. A method according to claim 1, wherein the magnetic field applied during the polarization holding RF pulse sequence has a homogeneity of less than 300 ppm.

16. A method according to claim 1, wherein the dissolving or melting step occurs while the hyperpolarized sample is exposed to a magnetic field.

17. A method according to claim 16, wherein the magnetic field applied during the dissolving or melting step has a strength greater than 1T.

18. A method according to claim 1, wherein the hyperpolarizing process is dynamic nuclear polarization.

19. A method according to claim 1, wherein the method further comprises subjecting the stabilized sample to a relatively high, homogeneous field and applying a readout pulse sequence to obtain NMR signals.

20. A method according to claim 19, wherein during the readout step, the magnetic field strength is greater than 0.2T.

21. A method according to claim 19, wherein the homogeneity of the field applied during the readout step is less than 300 ppm.

22. A method according to claim 1, wherein the stabilized sample is conditioned whilst subjected to a low strength or zero magnetic field so as to make it biologically acceptable.

23. A method according to claim 22, wherein the conditioning step comprises one or more of filtering, buffering and equilibrating to body temperature.

24. A method according to claim 22, further comprising supplying the conditioned, stabilized sample to a subject where it acts as a contrast agent.

25. A method according to claim 24, wherein the subject is a human or an animal.

* * * * *